United States Patent
Cho et al.

(10) Patent No.: US 7,688,621 B2
(45) Date of Patent: *Mar. 30, 2010

(54) MEMORY SYSTEM, MEMORY DEVICE AND APPARATUS INCLUDING WRITING DRIVER CIRCUIT FOR A VARIABLE RESISTIVE MEMORY

(75) Inventors: Beak-hyung Cho, Osan (KR); Woo-yeong Cho, Kyungki-do (KR); Hyung-rok Oh, Seongnam (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/949,299

(22) Filed: Dec. 3, 2007

(65) Prior Publication Data

US 2009/0059658 A1 Mar. 5, 2009

Related U.S. Application Data

(63) Continuation-in-part of application No. 11/324,907, filed on Jan. 4, 2006, now Pat. No. 7,304,886, which is a continuation of application No. 10/829,807, filed on Apr. 22, 2005, now Pat. No. 7,012,834.

(30) Foreign Application Priority Data

Jun. 3, 2003 (KR) .............................. 2003-35607

(51) Int. Cl.
*G11C 11/00* (2006.01)

(52) U.S. Cl. ............. 365/163; 365/189.07; 365/189.16; 365/233

(58) Field of Classification Search ................. 365/163, 365/189.16, 233, 189.07
See application file for complete search history.

(56) References Cited

U.S. PATENT DOCUMENTS 6,314,014 B1 * 11/2001 Lowrey et al. .............. 365/100
6,545,907 B1 * 4/2003 Lowrey et al. .............. 365/163

* cited by examiner

*Primary Examiner*—Son Dinh
(74) *Attorney, Agent, or Firm*—F. Chau & Associates, LLC

(57) ABSTRACT

An apparatus, a nonvolatile memory device and a nonvolatile memory system include an array of nonvolatile variable resistive memory (VRM) cells and a writing driver circuit having a pulse selection circuit, a current control circuit, and a current drive circuit. The current control circuit receives a bias voltage, outputs a control signal at a second level during an enable duration of the reset pulse when the data is at a first level, and outputs a control signal at a first level during an enable duration of the set pulse when the data is at a second level. The current drive circuit outputs writing current to the phase-change memory array during the enable duration of the reset pulse or the set pulse. The writing driver circuit can select the reset pulse or the set pulse according to the logic level of the data, and control the level of current applied to the phase-change memory array according to the reset pulse or the set pulse.

20 Claims, 10 Drawing Sheets

MEMORY SYSTEM, MEMORY DEVICE AND APPARATUS INCLUDING WRITING DRIVER CIRCUIT FOR A VARIABLE RESISTIVE MEMORY

CROSS-REFERENCE TO RELATED APPLICATIONS

This application is a continuation-in-part of applicants' co-pending U.S. patent application Ser. No. 11/324,907 filed Jan. 4, 2006 which is a continuation of application Ser. No. 10/829,807, filed Apr. 22, 2004 issued as U.S. Pat. No. 7,012, 834. This application claims priority of Korean Patent Application No. 2003-35607, filed Jun. 3, 2003. The above referenced documents are incorporated by reference herein.

BACKGROUND OF THE INVENTION

1. Field of the Invention

The present invention relates to a non-volatile memory system, memory devices and apparatus that include a non-volatile memory system. More particularly, the present invention relates to a non-volatile memory systems, memory devices and apparatus that include a pulse-writing driver circuit for writing data in a nonvolatile memory including a variable resistive memory (VRM) or a phase change random-access memory (PRAM) array.

2. Description of the Related Art

Variable resistive memory (Flash memory) systems are being applied to a number of applications, particularly when embedded or packaged in an enclosed card that is removably connected with a host system. Currently available removable memory card formats include that of the Personal Computer Memory Card International Association (PCMCIA), CompactFlash (CF) MultiMediaCard (MMC) and Secure Digital (SD). Host systems with which such cards are used include personal computers, notebook computers, cellular telephones, hand held computing devices (PDAs), digital cameras, audio recording devices, and more. Variable resistive memory (VRM) systems are also utilized as bulk mass storage embedded in host systems as Solid State Drives (SSD) or as Hybrid (Flash/Hard-Disk) drives.

A variable resistive memory (VRM) also known as phase-change random access memory (PRAM), ovonic or chalcogenide memory, is a non-volatile memory that stores data using a phase-change material (e.g. chalcogenide amorphous semiconductors, such as Ge—Sb—Tb (GST)), whose resistance is changed (electrically programmed) according to a phase change due to a temperature change, VRM have all the advantages of a dynamic random access memory (DRAM) and also have non-volatile and low power consumption properties. Phase-change memories use current to heat up a ceramic alloy of germanium, antimony and tellurium; Ge2Sb2Te5, or GST. A bit is represented by changing the phase of the GST chalcogenide material from a resistive amorphous state, referred to as the reset state, to a crystalline state, called the set state.

Whether the phase-change material GST is transformed into a crystalline state or an amorphous state is determined by the magnitude of current flowing in the phase-change material GST and the timing of that current. When strong current flows in the phase-change material GST for a short period of time, (followed by a rapid quench period) the phase-change material GST is transformed into an amorphous (high resistance) state. The amorphous state is referred to as a reset state and corresponds to data "1".

When current weaker than the reset current flows in the phase-change material GST for a longer period of time, the phase-change material GST is transformed into a crystalline (conducting) state which is referred to as a set state and corresponds to data "0".

FIG. 1 is an equivalent circuit diagram of a nonvolatile memory cell 100.

A nonvolatile variable resistive (phase-change) memory cell 100 operates by converting a small volume of the chalcogenide (variable resistive material GST) material back and forth between the crystalline and amorphous phases and includes one switch (transistor) TR and one variable resistor GST. The variable resistive material is a phase-change material (e.g., Ge—Sb—Tb). A word line WL is connected to control the transistor TR, and a bit line BL is connected to supply current through the variable resistive (phase-change) material GST (and through the transistor TR when it is conducting).

The variable resistive (phase-change) material GST has the physical property that its resistivity is changed by orders of magnitude (e.g., by $10^3$) as it is transformed from an amorphous state to a crystalline state. The variable resistive (phase-change) material GST becomes crystalline or amorphous depending on temperature and heating time and cooling (quench) time, so as to store information.

For a phase-change of the variable resistive (phase-change) material GST, a temperature higher than 900° C. is generally necessary. The phase-change is achieved by Joule Heating using current applied to the phase-change material (GST resistor) of a memory cell 100.

In a write operation, a GST resistor in a memory cell 100 may be transformed into an amorphous (high resistance) state by performing the steps of: causing write current "i" to flow through the variable resistive (phase-change) material (GST resistor), heating the variable resistive (phase-change) material (GST resistor) to a melting temperature Tm, and fast quenching the variable resistive (phase-change) material GST. Rapid cooling of the material to below its glass transition temperature causes the material to be locked into its amorphous phase. Accordingly, the variable resistive (phase-change) material (GST resistor) stores information "1" in its amorphous state. Such an amorphous state is referred to as a reset state.

To switch the phase-change memory element (GST resistor) back to its conductive state, the material is heated to a temperature between the glass transition temperature and the melting temperature, causing nucleation and crystal growth to rapidly occur over a period of several nanoseconds. A GST resistor in a memory cell 100 may be transformed into a crystalline (conducting) state by performing the steps of causing write current "ii" to flow in the variable resistive (phase-change) material GST, heating the variable resistive (phase-change) material GST to at least a crystallization temperature Tc, maintaining the temperature of the GST material at crystallization temperature Tc for a predetermined period of time (for allowing the formation of crystals in the GST material), and quenching the variable resistive (phase-change) material GST. Accordingly, the variable resistive (phase-change) material (GST resistor) stores information "0" in a crystalline state. Such a crystalline state is referred to as a set state.

The variable resistive (phase-change) material GST becomes crystalline (set) or amorphous (reset) according to data-controlled current supplied from the outside the memory cell 100. The resulting phase-change is dependant upon the magnitude of write-current and the width (duration) of the write-current pulse. Current necessary for amorphousness is called reset current "i" and current necessary for crystallization is called set current "ii". The magnitude of the reset current "i" is generally greater than the magnitude of the set current "ii" and the time for applying the reset current "i" is shorter than time for applying the set current "ii". It is possible to write to the memory device at pulse durations of nanoseconds.

In a read operation, a bit line and a word line are selected and a specific memory cell 100 is selected. Next, current flows from the outside and a voltage potential according to the resistance of the variable resistive (phase-change) material GST is measured using a sense-amplifying circuit (not shown), such that the stored information ("1" or "0") is determined.

FIG. 3 is a block diagram of a conventional pulse-write circuitry for a general write operation in a nonvolatile memory device.

FIG. 4 is a timing diagram of the pulse-write operation in the nonvolatile memory device of FIGS. 1 and 3.

Referring to FIG. 3, a word line (WL of FIG. 1) is selected by a row selector 320 which receives a row address, and a bit line (BL of FIG. 1) is selected by a column selector 340 which receives a column address. A nonvolatile memory cell (100 in FIG. 1) within the array 310 is selected by the word line and the bit line and stores a "1" or a "0" in response to data-controlled current supplied from the outside the memory cell (100).

The pulse-write operation of conventional phase-change conventional pulse-write circuitry 300 will be described in further detail with reference to signal timing depicted in FIG. 4. A data buffer 350 receiving DATA generates a write control signal WMDL. The write control signal WMDL has the same logic level as the DATA.

A control logic 360 responds to control signals /CS, /WE, /UB, /LB, and /OE input from the outside to generate a driver control signal PWD which controls a write-current driver 330. When the driver control signal PWD is a high level, the write-current driver 330 is operated.

The driver control signal PWD has a different pulse width depending upon whether the DATA is "1" or "0". This is because time needed to transform the variable resistive (phase-change) material GST into a crystalline state is different from time needed to transform the phase-change material GST into an amorphous state as described above.

When the write control signal WMDL is a high level and the driver control signal PWD is a high level, the bit line applies reset current to a memory cell (100) within the nonvolatile memory array 310. When the write control signal WMDL is a low level and the driver control signal PWD is a high level, the bit line applies set current to the memory cell (100) within the nonvolatile memory array 310

As explained above, to store DATA (e.g., "1" or "0") in the variable resistive (e.g., phase-change) memory device, both the writing current and duration of its application will be controlled according to the DATA to be written.

SUMMARY OF THE INVENTION

A writing driver circuit is provided that writes data into a memory cell (e.g., 100 of FIG. 1) within an array of nonvolatile memory cells of a nonvolatile memory device. The VRM memory device implements a nonvolatile memory system including the writing driver circuit, the array of nonvolatile memory cells, a controller circuit, and a host interface. The host may be any of various apparatus including personal computers, notebook computers, cellular telephones, hand held computing devices (PDAs), digital cameras, audio recording devices.

According to an aspect of the present invention, there is provided a nonvolatile memory device comprising a writing driver circuit for driving a nonvolatile memory cell. The writing driver circuit includes: a pulse selection circuit that outputs a selected one of a reset pulse and a set pulse in response to a logic level of data and the data; a current control circuit that receives a bias voltage, outputs a control signal at a second level during an enable duration of the reset pulse when the data is at a first level, and outputs the control signal at a first level during an enable duration of the set pulse when the data is at a second level, and a current drive circuit that outputs writing current to the phase-Change memory array in response to the control signal during the enable duration of the reset pulse or of the set pulse.

According to another aspect of the present invention, there is provided an apparatus comprising the writing driver circuit.

According to another aspect of the present invention, there is provided a nonvolatile memory system comprising the writing driver circuit.

BRIEF DESCRIPTION OF THE DRAWINGS

The preferred embodiments of the present invention will be described in detail with reference to the attached drawings in which.

DETAILED DESCRIPTION OF EXEMPLARY EMBODIMENTS OF THE INVENTION

Figure 5:
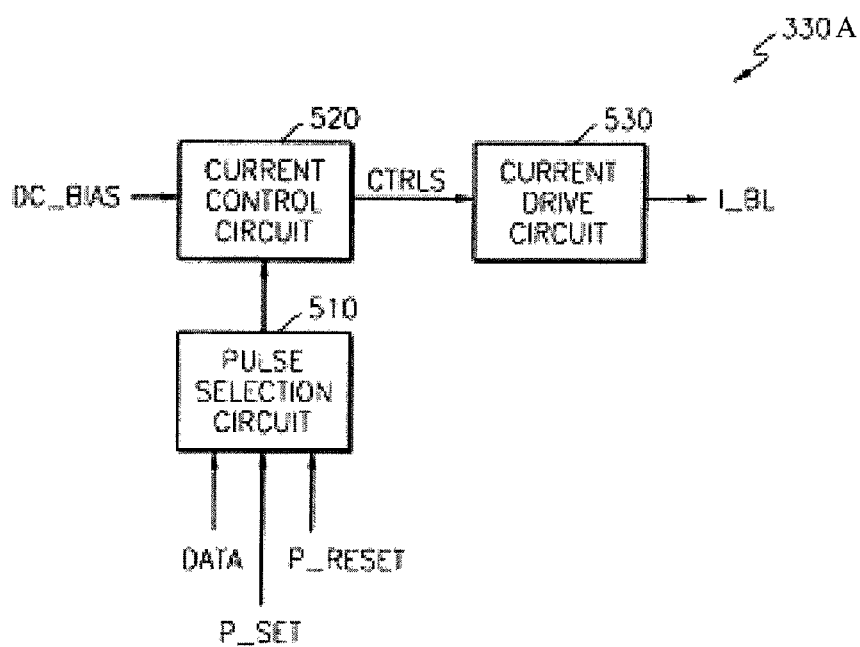
FIG. 5 is a block diagram of a writing driver circuit 330A according to a first preferred embodiment of the present invention.

FIG. 5 is a block diagram of a writing driver circuit 330A according an exemplary embodiment of the present invention. Referring to FIG. 5, the writing driver circuit 330A includes a pulse selection circuit 510, a current control circuit 520, and a current drive circuit 530. The current drive circuit 530 drives a pulse-width and amplitude modulated current through the nonvolatile (VRM) memory cell 100 of FIG. 100 using column (word Line WL) selection circuits and row (bit line BL) selection circuits (not shown). The pulse selection circuit 510 outputs either of a reset pulse P_RESET and a set pulse P_SET in response to a logic level of DATA and the DATA.

The pulse select ion circuit 510 functions to selectively apply the reset pulse P_RESET or the set pulse P_SET to the current control circuit to write "1" or "0" in a selected cell of a phase-change memory array.

Here, the reset pulse P_RESET and the set pulse P_SET are current pulses. The enable duration of the reset pulse P_RESET is shorter than the enable duration of the set pulse P_SET.

The current control circuit 520 receives a bias voltage DC_BIAS, outputs a control signal CTRLS at a second level during the enable duration of the reset pulse P_RESET when the DATA is at a first level, and outputs a control signal CTRLS at a first level during the enable duration of the set pulse P_SET when the DATA is at a second level.

The current control circuit 520 functions to control the amount of current supplied to the current drive circuit 530 during the enable duration of the reset pulse P_RESET or the set pulse P_SET. A level of writing current corresponding to the reset pulse P_RESET is higher than a level of writing current corresponding to the set pulse P_SET.

The bias voltage DC_BIAS has a constant voltage, and helps the current control circuit 520 to be performed stably. A voltage level of the bias voltage DC_BIAS can be changed through an external PAD.

The level of writing current corresponding to the reset pulse P_RESET or the set pulse P_SET is changed depending on the level of the bias voltage DC_BIAS. Thus, the writing driver circuit 330A can increase or decrease the level of the control signal CTRLS in response to a change of the bias voltage DC_BIAS.

The current drive circuit 530 outputs writing current I_BL to the phase-change memory array through a first output node in response to the control signal during the enable duration of the reset pulse P_RESET or the set pulse P_SET, and discharges the output node during a disable duration of the reset pulse P_RESET or the set pulse P_SET.

Figure 6:
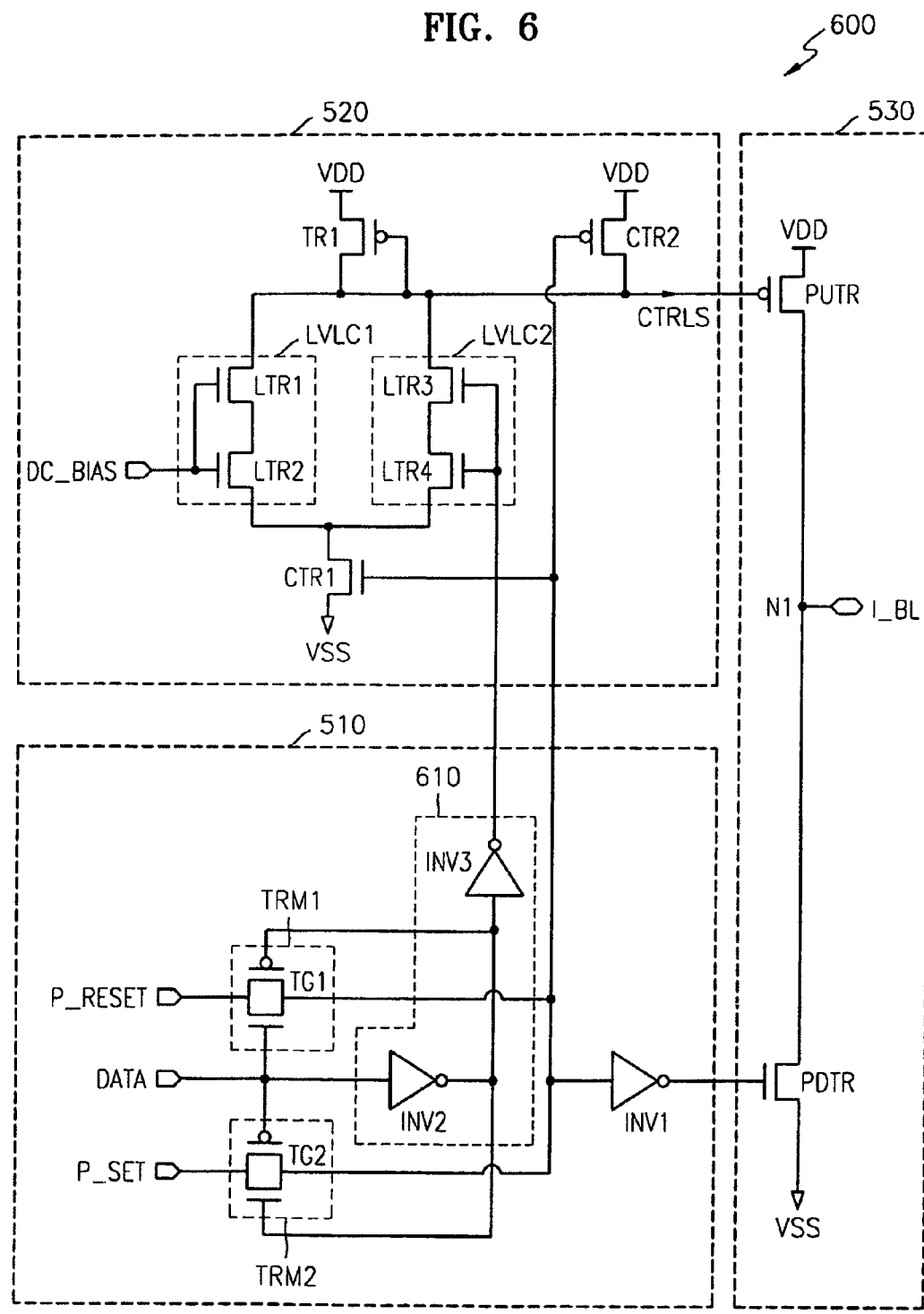
FIG. 6 is a circuit diagram of the writing driver circuit of FIG. 5.

FIG. 6 is a circuit diagram of the writing driver circuit of FIG. 5,

Referring to FIG. 6, the pulse selection circuit 510 includes a first transmitter TRM1, a second transmitter TRM2, a buffer 610, and a first inverter INV1.

The first transmitter TRM1 outputs the reset pulse P_RESET in response to a logic level of the DATA. The second transmitter TRM2 outputs the set pulse P_SET in response to a logic level of the DATA. The first transmitter TRM1 and the second transmitter TRM2 include transmission gates TG1 and TG2, respectively, which are turned ON or OFF in response to the DATA and inverted data.

When either of the first transmitter TRM1 and the second transmitter TRM2 is turned ON, the other is turned OFF. The buffer 610 buffers the DATA and outputs the buffered data to the current control circuit 520. The buffer 610 includes a second inverter INV2 which inverts the DATA to generate inverted DATA, and a third inverter INV3 which inverts the inverted DATA and outputs the DATA to the current control circuit 520.

The first inverter INV1 inverts output of the first transmitter TRM1 or of the second transmitter TRM2, and outputs the inverted output to the current drive circuit 530.

For convenience in description, the first data level of the DATA is a high level and the second data level of the DATA is a low level. When the DATA is at a high level, the transmission gate TG1 of the first transmitter TRM1 is turned ON, and the transmission gate TG2 of the second transmitter TRM2 is turned OFF. Next, the first transmitter TRM1 applies the reset pulse P_RESET to the current control circuit 520 and the first inverter INV1 applies an inverted signal of the reset pulse P_RESET to the current drive circuit 530.

In contrast, when the DATA is at a low level, the transmission gate TG2 of the second transmitter TRM2 is turned ON, and the transmitter TG1 of the first transmitter TRM1 is turned OFF. Next, the second transmitter TRM2 applies the set pulse P_SET to the current control circuit 520, and the first inverter INV1 applies an inverted signal of the set pulse P_SET to the current drive circuit 530.

The current control circuit 520 includes a first transistor TR1, a first level controller LVLC1, a second level controller LVLC2, a first control transistor CTR1, and a second control transistor CTR2.

The first transistor TR1 has a source connected to a first voltage VDD, and a gate and a drain connected to each other. The first transistor TR1 is a PMOS transistor. The first level controller LVLC1 is turned ON in response to the bias voltage DC_BIAS and controls the level of the control signal CTRLS.

In further detail, the first level controller LVLC1 includes a first level transistor LTR1 and a second level transistor LTR2 that are connected in series between a drain of the first transistor TR1 and a drain of the first control transistor CTR1. The bias voltage DC_BIAS is applied to gates of the first level transistor LTR1 and the second level transistor LTR2.

The second level controller LVLC2 controls the control signal CTRLS to be generated at a first level or a second level in response to the DATA output from the pulse selection circuit 510. The second level controller LVLC2 includes a third level transistor LTR3 and a fourth level transistor LTR4 that are connected in series between the drain of the first transistor TR1 and the drain of the first control transistor CTR1. The DATA is applied to gates of the third level transistor LTR3 and the fourth level transistor LTR4. The first through fourth level transistors LTR1, LTR2, LTR3, and LTR4 are NMOS transistors.

The first control transistor CTR1 controls operation of the current control circuit 520 in response to the reset pulse P_RESET or the set pulse P_SET. The first control transistor CTR1 has a drain commonly connected to sources of the second level transistor LTR2 and the fourth level transistor LTR4, a source connected to a second voltage VSS, and a gate to which the reset pulse P_RESET or the set pulse P_SET is applied. The first control transistor CTR1 is an NMOS transistor.

The second control transistor CTR2 turns OFF the first transistor TR1 during the disable duration of the reset pulse P_RESET or the set pulse P_SET and outputs the control signal CTRLS at a third level. The second control transistor CTR2 has a source connected to a first voltage VDD, a drain connected to a drain of the first transistor TR1, and a gate to which the reset pulse P_RESET or the set pulse P_SET is applied. The second control transistor CTR2 is a PMOS transistor.

The current drive circuit 530 includes a pull up transistor PUTR and a purl down transistor PDTR. The pull up transistor PUTR has a source connected to a first voltage VDD, a drain connected to a first node N1, and a gate to which the control signal CTRLS is applied.

The pull down transistor PDTR has a drain connected to the first node N1, a source connected to a second voltage VSS, and a gate to which an inverted signal of the reset pulse P_RESET or the set pulse P_SET is applied.

The pull down transistor PDTR is turned OFF and the pull up transistor PUTR is turned ON during the enable duration of the reset pulse P_RESET or the set pulse P_SET. The degree to which the pull up transistor PUTR is turned ON is controlled according to the level of the control signal CTRLS, and accordingly the amount of writing current I_BL applied to the phase-change memory array in a set pulse and in a reset pulse is adjustable and can be externally adjusted.

The pull up transistor PUTR is turned OFF and the pull down transistor PDTR is turned ON during the disable duration of the reset pulse P_RESET or the set pulse P_SET. The first node N1 from which the writing current I_BL is output is connected to the second voltage VSS and discharged.

The first level controller LVLC1 is turned ON in response to the bias voltage DC_BIAS. When the DATA is applied at a second level, namely, a low level, the set pulse P_SET is applied to the first control transistor CTRL and the second control transistor CTR2 of the current control circuit 520. During the enable duration of the set pulse P_SET, the first control transistor CTR1 is turned ON and the second control transistor CTR2 is turned OFF and the first transistor TR1 is turned ON.

The third level transistor LTR3 and the fourth level transistor LTR4 of the second level controller LVLC2 are turned OFF in response to the DATA of a low level. When the first control transistor CTRL, and the first level transistor LTR1 and the second level transistor LTR2 are turned ON, the control signal CTRLS is generated at a first level such that the pull up transistor PUTR is turned ON. Here, the first control level of the control signal CTRLS is a low level.

During the enable duration of the set pulse P_SET, the pull up transistor PUTR is turned ON and the pull down transistor PDTR is turned OFF. During the disable duration of the set pulse P_SET (when the set pulse P_SET is disabled) the second control transistor CTR2 is turned ON and the control signal CTRLS is generated at a high level. The pull up transistor PUTR is turned OFF and the pull down transistor PDTR is turned ON, thereby discharging the first node N1 to the VSS (e.g., ground) voltage level.

When the DATA is applied at a first level, namely, a high level, the reset pulse P_RESET is applied to the first control transistor CTR1 and the second control transistor CTR2 of the current control circuit 520. During the enable duration of the reset pulse P_RESET, the first control transistor CTR1 is turned ON and the second control transistor CTR2 is turned OFF and the first transistor TR1 is turned ON.

The third level transistor LTR3 and the fourth level transistor LTR4 of the second level controller LVLC2 are turned ON in response to the DATA of a high level. When the first control transistor CRT1, and the first through fourth level transistors LTR1, LTR2, LTR3, and LTR4 are all turned ON, the control signal CTRLS is generated at a second level, such that the pull up transistor PUTR is turned ON. Here, the second control level of the control signal CTRLS is a low level, which is lower than the first control level of the control signal CTRLS previously described.

Therefore, when the DATA is at a high level, the control signal GIRLS becomes a lower level. As a consequence, the level of the control signal CTRLS further decreases and the pull up transistor PUTR of the current drive circuit 530 is turned ON more, compared with a case where only the first and second level transistors LTR1 and LTR2 are turned ON. The level of the writing current I_BL becomes higher than when the DATA is at a low level.

Thus, when the DATA is at a high level, the reset pulse P_RESET is applied to the current control circuit 520. In this case, the level of writing current I_BL is higher than the level of writing current in the case where the set pulse P_SET is applied to the current control circuit 520 when the DATA is at a low level.

During the disable duration of the set pulse P_SET or the reset pulse P_RESET, the second control transistor CTR2 is turned ON and the control signal CTRLS is generated at a third level, namely, a high level and the pull up transistor PUTR is turned OFF. At this time, since the pull down transistor PDTR is turned ON, the first node N1 is discharged to the second voltage VSS.

Figure 7:
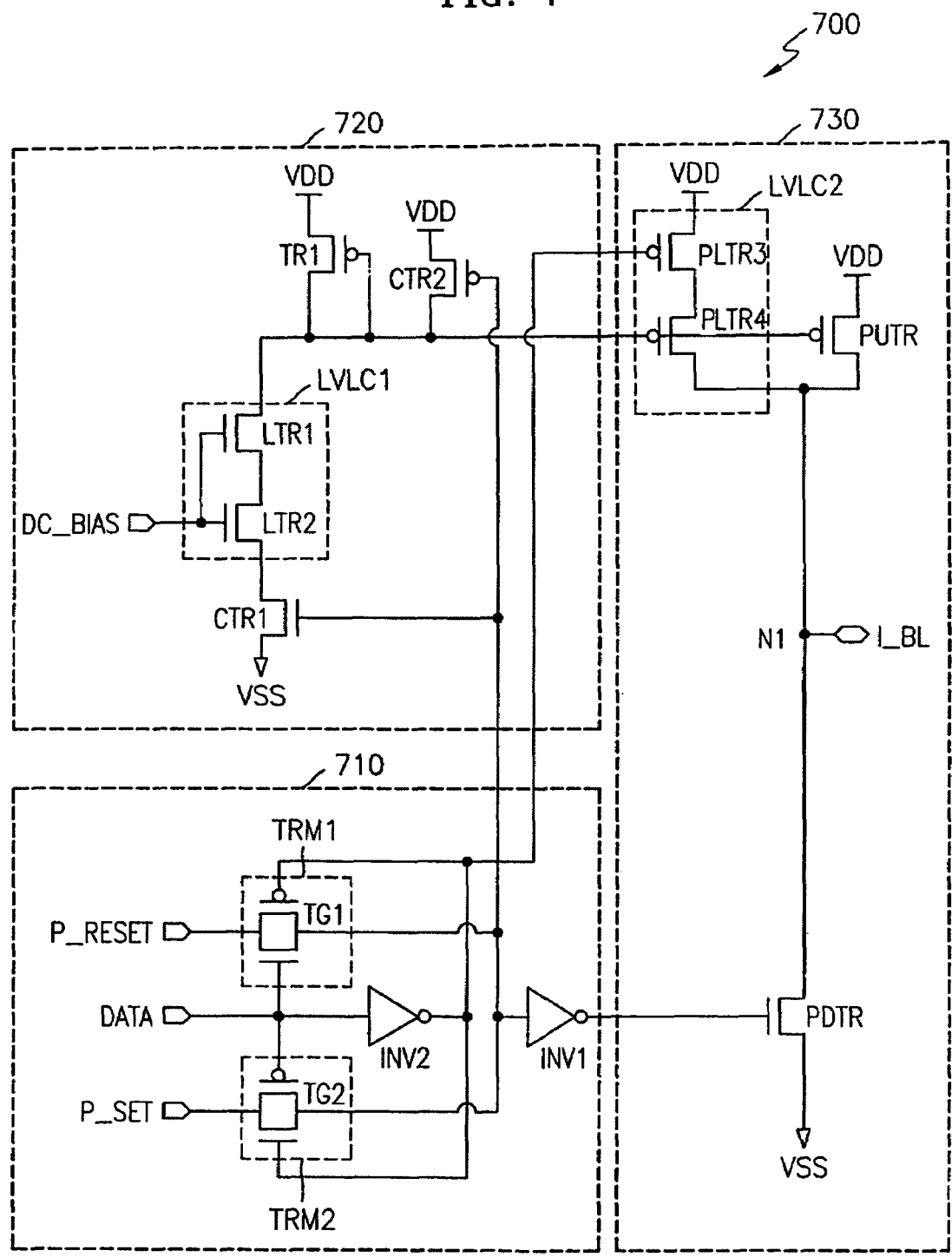
FIG. 7 is a circuit diagram of a writing driver circuit according to a second preferred embodiment of the present invention.

FIG. 7 is a circuit diagram of a writing driver circuit according to a second preferred embodiment of the present invention.

Referring to FIG. 7, the writing driver circuit 700 includes a pulse selection circuit 710, a current control circuit 720, and a current drive circuit 730.

The pulse selection circuit 710 receives a reset pulse P_RESET and a set pulse P_SET and outputs a selected one of the reset pulse P_RESET and a set pulse P_SET in response to the logic level of DATA, and outputs an inverted data. The pulse selection circuit 710 has the same construction as the pulse selection circuit 510 of FIG. 6 except that it does not include a third inverter INV3. Accordingly, a detailed description of the construction of the pulse selection circuit 710 will be omitted.

The current control circuit 720 receives a bias voltage DC_BIAS, outputs a control signal CTRLS at a second level when the data is at a first level during an enable duration of the reset pulse P_RESET, and outputs the control signal at a first level when the data is at a second level during an enable duration of the set pulse, and outputs the control signal CTRLS at a third level during a disable duration of the reset pulse P_RESET and the set pulse P_SET. The current control circuit 720 has the same construction as the current control circuit 520 of FIG. 6 except that it does not contain a second level controller (e.g., LVLC2). Accordingly, a detailed description of the construction of the current control circuit 720 will be omitted.

The current drive circuit 730 outputs writing current I_BL at a first level or a second level to a phase memory array though a first node N1 during the enable duration of the reset pulse P_RESET or the set pulse P_SET respectively, in response to a logic level of (inverted) DATA, and discharges the first node N1 (to a third voltage level) during the disable duration of the reset pulse P_RESET or the set pulse P_SET.

The current drive circuit 730 includes a second level controller LVLC2, a first pull up transistor PUTR, a second pull up transistor (e.g. transistor stack PLTR3 & PLTR4) and a pull down transistor PDTR.

The second level controller LVLC2 outputs a portion of the writing current I_BL output by the current drive circuit 730 at a first level through the first node N1 in response to the control signal CTRLS during the enable duration of the reset pulse P_RESET when the inverted data is at a second level.

The second level controller LVLC2 includes a third level transistor PLTR3 and a fourth level transistor PLTR4. The third level transistor PLTR3 has a source connected to a first voltage VDD, and a gate to which the inverted data is applied. The fourth level transistor PLTR4 has a source connected to a drain of the third level transistor PLTR3, a drain connected to the first node N1, and a gate to which the control signal CTRLS is connected.

The pull up transistor PUTR outputs the writing current I_BL at a second level through the first node N1 in response to the control signal CTRLS during the enable duration of the set pulse P_SET when the inverted DATA is at a first level. The pull up transistor PUTR has a source connected to a first voltage VDD, a drain connected to the first node N1, and a gate to which the control signal CTRLS is applied.

The pull down transistor PUTR discharges the first node N1 during the disable duration of the reset pulse P_RESET or the set pulse P_SET irrespective of a logic level of the DATA. The pull down transistor PDTR has a drain connected to the first node N1, a source connected to a second voltage VSS, and a gate to which an inverted signal of the reset pulse P_RESET or the set pulse P_SET is applied.

The writing driver circuit 700 of FIG. 7 differs from the writing driver circuit 600 of FIG. 6 in that DATA is not applied to the current control circuit 720, and the inverted DATA is input to the second level controller LVLC2 of the current drive circuit 730, such that the level of the writing current I_BL is controlled according to a logic level of the DATA.

When the DATA is at a second level namely a low level, the second inverter INV2 generates the inverted data at a first level, namely, a high level. When the inverted DATA is at a high level, the third level transistor PLTR3 of the second level controller LVLC2 is turned OFF. The fourth level transistor PLTR4 is not operated.

When the DATA is at a second level, the set pulse P_SET is applied to the first control transistor CTR1 and the second control transistor CTR2 through the second transmitter TRM2. The first control transistor CTR1 is turned ON during the enable duration of the set pulse P_SET and the second control transistor CTR2 is turned OFF during the enable duration of the set pulse P_SET.

The first and second level transistors LTR1 and LTR2 of the first level controller LVLC1 of the current control circuit 720 are turned ON by the bias voltage DC_BIAS. Accordingly, during the enable duration of the set pulse P_SET, the control signal CTRLS is applied at a first level to the pull up transistor PUTR, and the pull up transistor PUTR is turned ON. The first control level of the control signal CTRLS is a level which can turn ON the pull up transistor PUTR and the fourth level transistor LTR4.

The control signal CTRLS is output at a third control level during the disable duration of the set pulse P_SET or the reset pulse P_RESET irrespective of the logic level of the DATA.

When the third and fourth level transistors PLTR3 and PLTR4 are not operated and the pull up transistor PUTR is turned ON by the first control level of the control signal CTRLS, the writing current I_BL is output at a second level. Thus, the second level of the writing current I_BL is a current level, which is applied to the phase-change memory array when the set pulse P_SET is selected in the pulse selection circuit 710.

When the DATA is at a first level, namely, a high level, the second inverter INV2 generates inverted data at a second level, namely, a low level. When the inverted DATA is at a low level, the third level transistor PLTR3 of the second level controller LVLC2 is turned ON.

When the DATA is at a first level, the reset pulse P_RESET is applied to the first control transistor CTR1 and the second control transistor CTR2 through the first transmitter TRM1. The first control transistor CTR1 is turned ON during the enable duration of the reset pulse P_RESET, and the second control transistor CTR2 is turned OFF during the enable duration of the reset pulse P_RESET.

The first and second level transistors LTR1 and LTR2 of the first level controller LVLC1 of the current control portion 720 are turned ON by the bias voltage DC_BIAS. Accordingly, during the enable duration of the reset pulse P_RESET, the control signal CTRLS is applied at a first level to the fourth level transistor PLTR4 and the pull up transistor PUTR of the current drive circuit 730, and the fourth level transistor PLTR4 and the pull up transistor PUTR are turned ON.

Since the third level transistor PLTR3 and the fourth level transistor PLTR4 are all turned ON, the writing current I_BL is output at a first level. Thus, the first level of the writing current I_BL is a current level, which is applied to the phase-change memory array when the reset pulse P_RESET is selected in the pulse selection circuit 710.

The first level of the writing current I_BL is higher than the second level of the writing current I_BL.

Whether a logic level of the DATA is a high level or a low level, the control signal CTRLS is generated at a first level, namely, a high level during the disable duration of the reset pulse P_RESET or the set pulse P_SET and turns OFF the pull up transistor PUTR. During the disable duration of the reset pulse P_RESET or the set pulse P_SET, the pull down transistor PDTR is turned ON and discharges the first node N1.

As described above, the writing driver circuit in exemplary embodiments of the present invention can select the reset pulse or the set pulse according to the logic level of the data, and control the level of current applied to the phase-change memory array according to the reset pulse or the set pulse.

Figure 8:
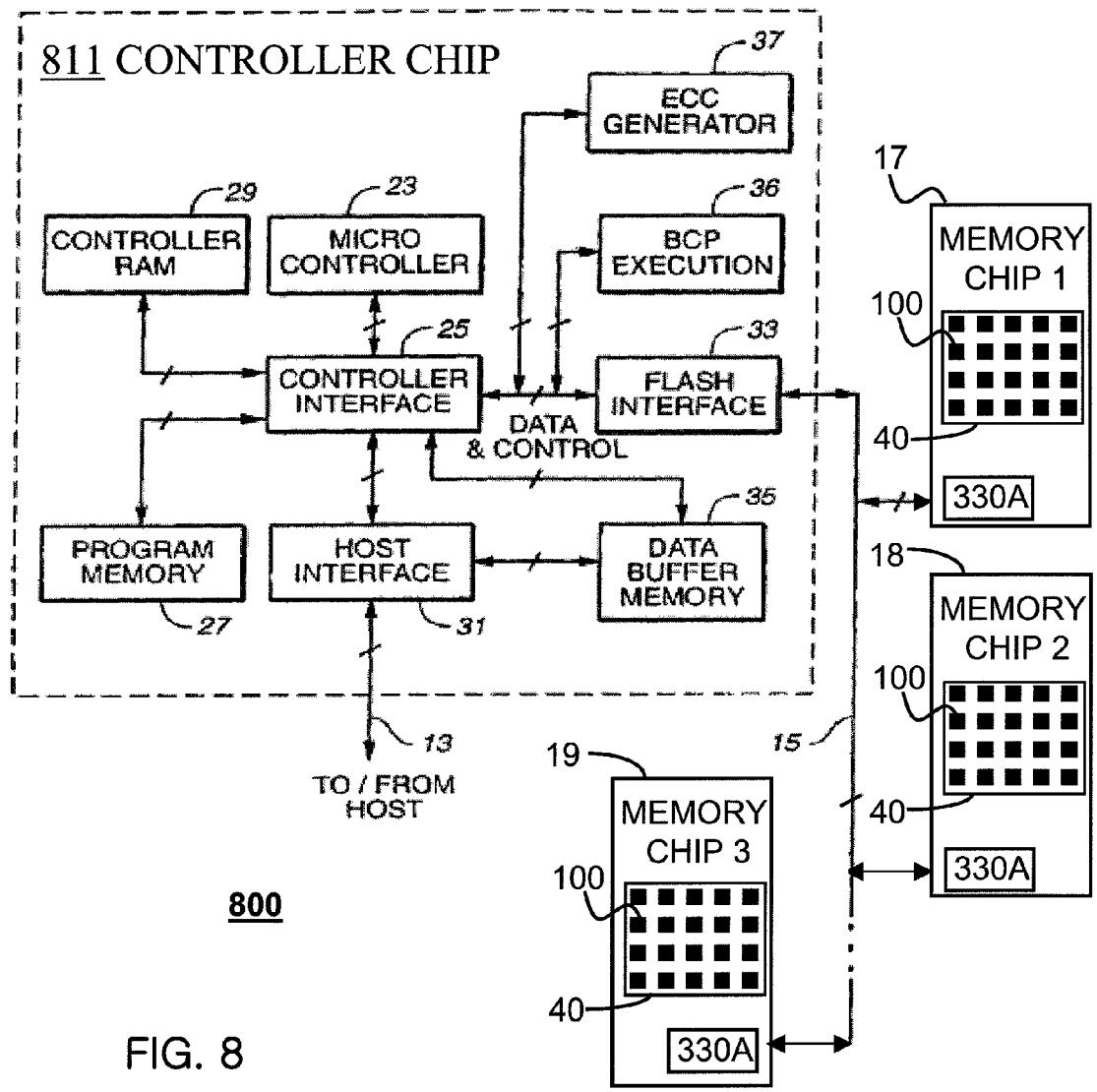
FIG. 8 is a circuit block diagram of a nonvolatile memory system 800 including the writing driver circuit 330A of FIG. 5.

FIG. 8 is a circuit block diagram of a nonvolatile memory system 800 including the writing driver circuit 330A of FIG. 5.

Figure 1:
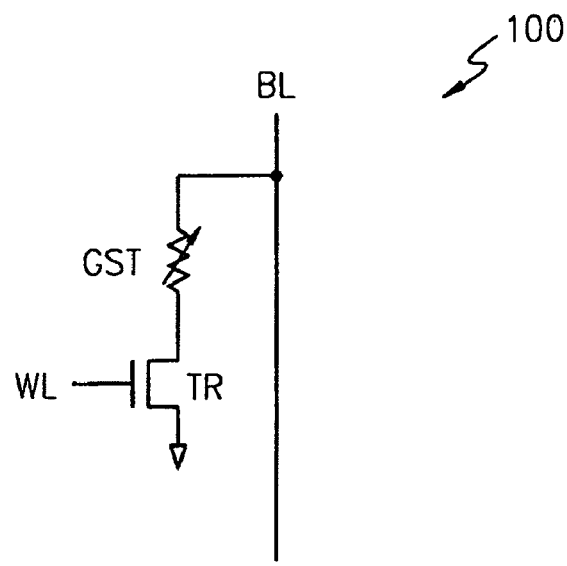
FIG. 1 is a diagram of an equivalent circuit of a nonvolatile (VRM) memory cell.
Figure 2:
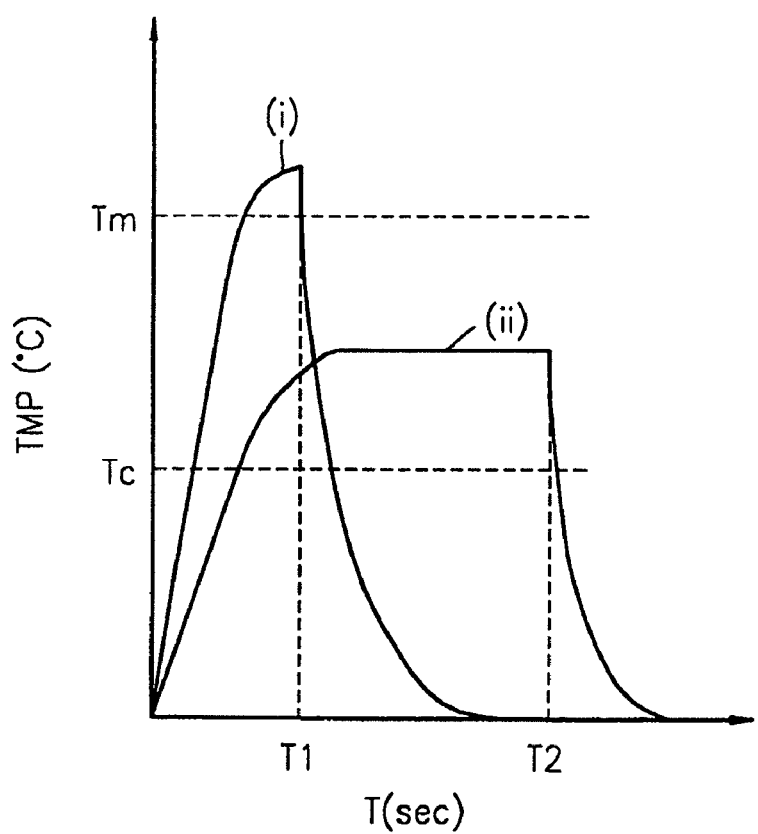
FIG. 2 is a time-current graph illustrating the operative currents used for writing data in a variable resistive (phase-change) material.
Figure 3:
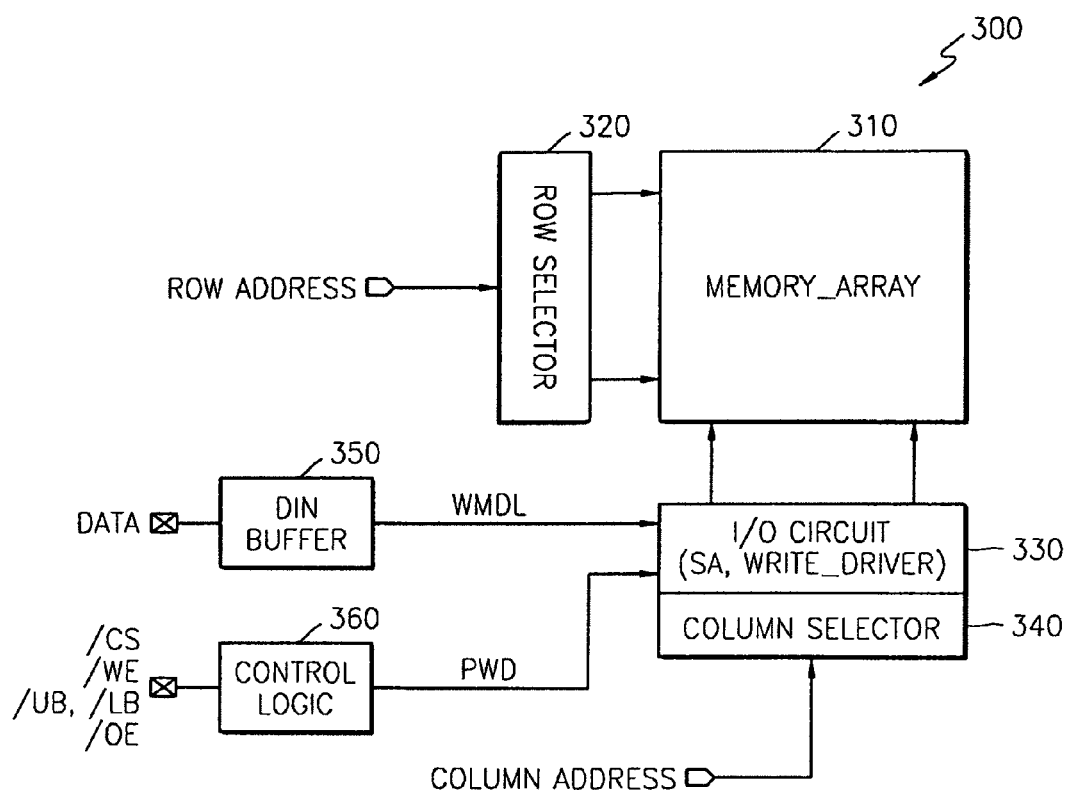
FIG. 3 is a block diagram of a conventional pulse-writing circuit for performing a write operation in a phase-change memory (PRAM) device.
Figure 4:
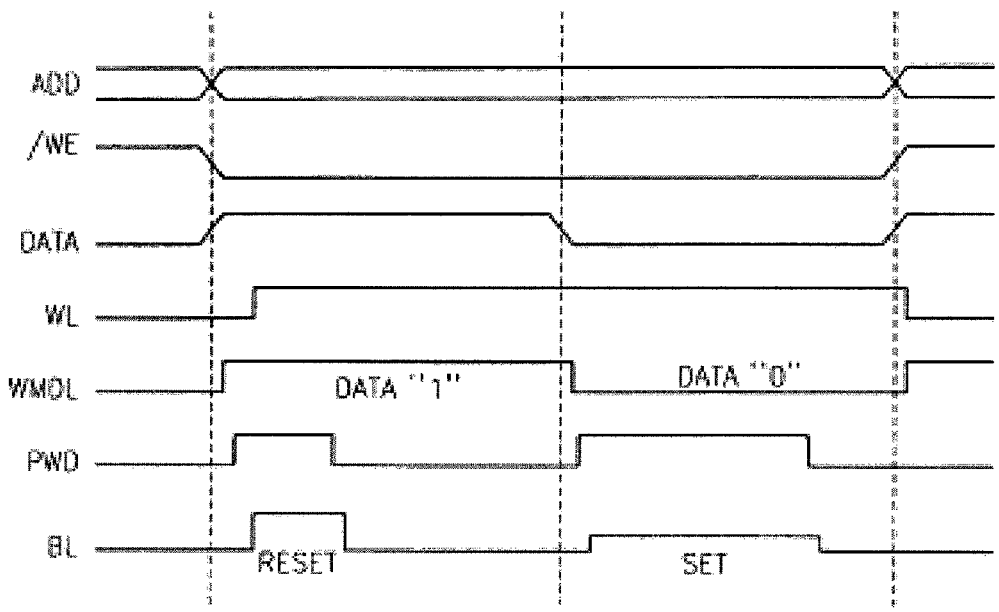
FIG. 4 is a timing diagram illustrating control signals used in the write operation in the pulse-writing circuit of FIG. 3.

Referring to FIG. 8, the nonvolatile memory system 800 includes a controller 811 that communicates with a host system (not shown see electronic host devices in FIGS. 13A to 13J) over lines 13. The controller 811, occupying one integrated circuit chip, communicates over lines 15 to one or more (e.g., three) nonvolatile memory chips 17, 19 and 21. Each of the three nonvolatile memory chips 17, 19 and 21 includes an array 40 of nonvolatile memory cells (e.g., phase-change memory cell 100 of FIG. 1), and one pulse-writing driver circuit 330A of FIG. 5.

The three nonvolatile memory chips 17, 19 and 21 may be formed on one or three separate integrated circuit chips. The controller 811 may be either contained on a single integrated circuit chip without an array of (VRM) memory cells, or integrated with one or more arrays of nonvolatile (VRM) memory cells on the same chip. Each array 40 of nonvolatile memory cells 100, is operatively connected to a corresponding one pulse-writing driver circuit 330A of FIG. 5.

Even if only one memory cell array 40 is integrated on the controller circuit chip, an additional one or more integrated circuit chips (e.g., 18, 19) that each contain a memory array 40 and a corresponding writing driver circuit 330A may be included in the nonvolatile memory system 800.

The nonvolatile memory system 800 shown in FIG. 8 can be embedded as part of a host system (see FIGS. 13A to 13J and FIG. 12) or packaged into a removable memory card, such as a memory card (see FIG. 11) formed according to one of the commercially established memory card standards such as MMC card, SD card, multiuse card, compact SD card, mini SD card, micro SD card, memory stick, ID card, PCMCIA card, SSD, chipcard, smartcard, and USB drives.

In the case of a nonvolatile memory system 800 packaged into a removable memory card (see e.g., FIG. 11), the lines 13 terminate in external terminals (a physical interface) on the card for mating with a complementary socket within a host system. Although the use of one controller chip 811 and multiple memory chips 17, 19, 21 is typical, the trend is, of course, to use fewer separate chips for implementing such a memory system 800 by combining their circuits into one integrated chip.

The controller 811 includes a micro-processor or micro-controller 23 connected through controller interface logic 25 to internal memories 27, 29, 35 and interfaces 31, 33 with external components. A program memory 27 stores the firmware and software executed by the micro-controller 23 to control the operations of the memory system 800 operation: to read data from the connected memory array(s) 17, 19, 21 and to transmit that data to the host; to write data from the host to the memory chip(s) 17, 19, 21, and to carry out numerous other monitoring and controlling functions. The memory 27 can be a volatile re-programmable random-access-memory (RAM), a nonvolatile memory that is not re-programmable (ROM), a one-time programmable memory (OTP) or a re-programmable EEPROM memory (e.g., an array of nonvolatile memory cells). If the memory 27 is re-programmable, the controller can be configured to allow the host system to program it. A random-access-memory (RAM) 29 is used to temporarily store, among other data, data from tables read from the nonvolatile memory arrays 17, 19, 21 that are accessed during reading and writing operations.

A logic circuit (host interface) 31 interfaces with the host communication lines 13, while another logic circuit (flash interface) 33 interfaces with the memory array(s) 17, 19, 21 through the lines 15. Another memory 35 is used as a buffer to temporarily store user data being transferred between the host system and nonvolatile memory arrays 17, 19, 21. The memories 29, 35 in the controller are usually volatile, since memories with fast access and other characteristics desired for efficient controller access typically have that characteristic, and may be combined physically into a single memory. A dedicated circuit 36 accesses the streaming user data being transferred to the memory and inserts dummy bytes into the data stream in order to avoid writing valid user data to memory cells 100 in bad columns of the array 40. A dedicated processing circuit 37 also accesses the streaming user data being transferred between the controller and flash interfaces 25 and 33 for generating an error correction code (ECC), or other type of redundancy code, based upon the user data. When user data is being transferred into a nonvolatile memory 17, 19, 21, the generated ECC is appended onto the user data and simultaneously written into the same physical block of the nonvolatile memory as part of the same sector as the user data.

User data is transferred between the controller 811 and multiple memory arrays 17, 19 and 21, in this example, over the lines 15. The separate memory arrays 40 of the separate memory chips 17, 19, 21 are individually addressed by the controller 811. The data bus within the lines 15 can be one byte wide.

Figure 9:
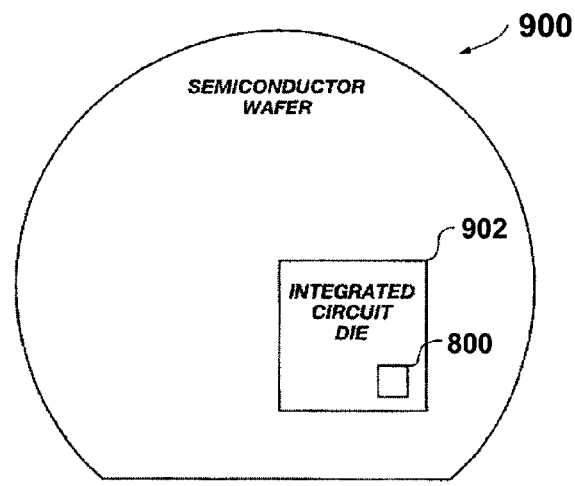
FIG. 9 is a diagram of a semiconductor wafer 900 including an integrated circuit die 102 incorporating the nonvolatile memory system 800 of FIG. 8.

FIG. 9 is a diagram of a semiconductor wafer 900 including an integrated circuit die 102 incorporating the nonvolatile memory system 800 of FIG. 8 having an integrated array 40 of nonvolatile memory cells 100 and one pulse-writing driver circuit 330A of FIG. 5.

Figure 10:
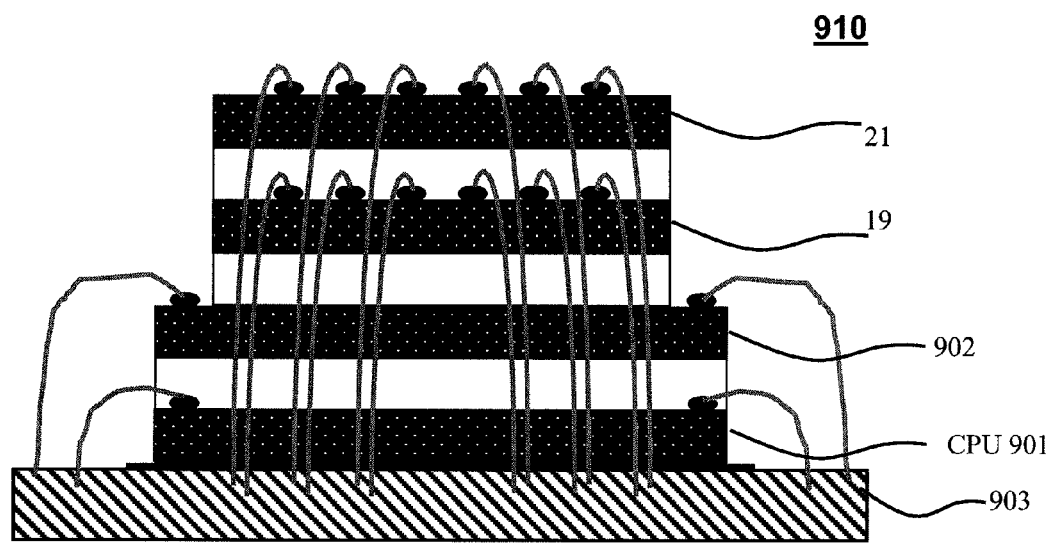
FIG. 10 is a view of a Multi-Chip Package (MCP) implementing the nonvolatile memory system 800 of FIG. 8.

FIG. 10 is a view of a Multi-Chip Package (MCP) 910 implementing the nonvolatile memory system 800 of FIG. 8. As shown in FIG. 10, a Multi-Chip Package (MCP) 910 includes a CPU, a controller 811, and memories 17, 19, 21 in the same package. A first integrated circuit die 901 incorporates a CPU. A second integrated circuit die 902 incorporates the nonvolatile memory system 800 of FIG. 8 having one integrated array 40 of nonvolatile memory cells 100 and one pulse-writing driver circuit 330A. The Multi-Chip Package (MCP) 910 of FIG. 10 further includes third and fourth integrated circuit dies 19, 21 each die incorporating an array 40 of nonvolatile memory cells 100 and one pulse-writing driver circuit 330A of FIG. 5. An insulating adhesive layer (white rectangle) is disposed between each adjacent pair of integrated circuit dies. The plurality of integrated circuit dies and interspersed insulating adhesive layers are mounted (stacked) on an insulating substrate 903. The insulating substrate 903 may comprise multiple wiring layers and plated through holes, for interconnecting the plurality of stacked integrated circuit dies via wires, as shown.

Figure 11:
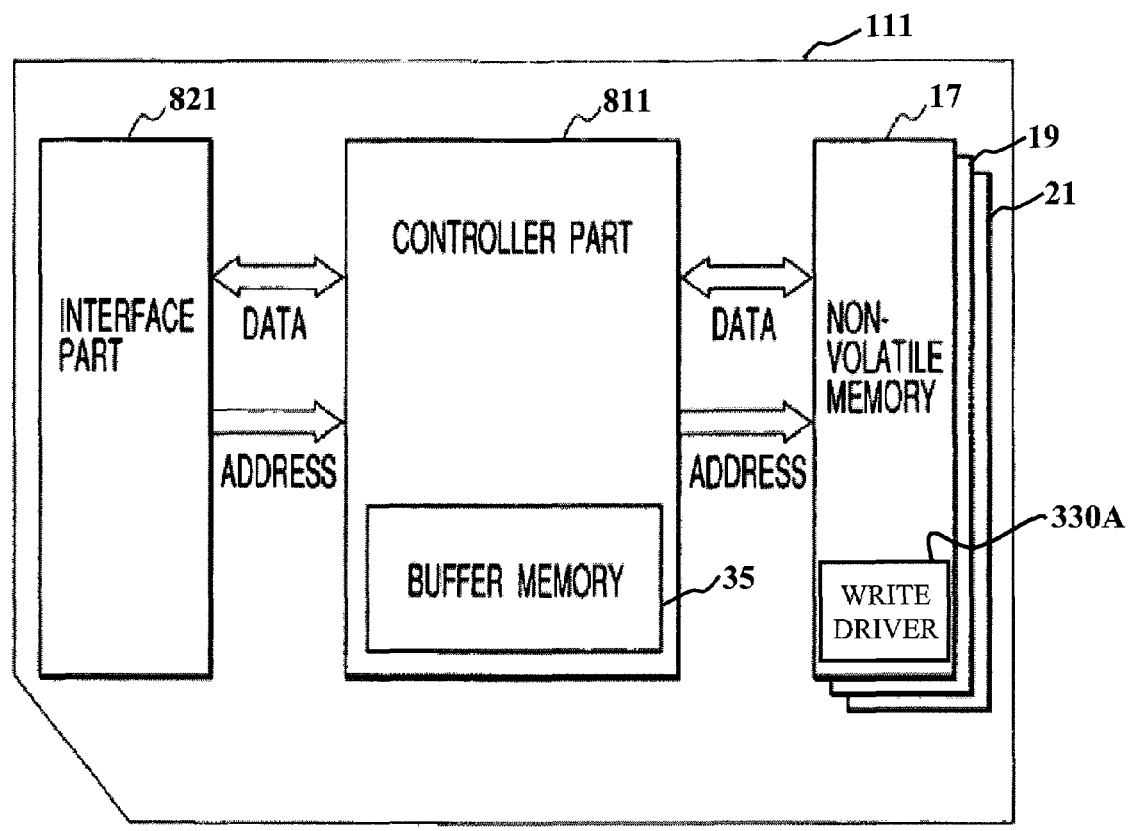
FIG. 11 illustrates a nonvolatile memory device 111 including the nonvolatile memory system 800 of FIG. 8.

FIG. 11 is a block diagram of a nonvolatile memory device 111 including a writing driver 330A of FIG. 5 according to an exemplary embodiment of the present invention. The nonvolatile memory device 111 may have its form factor and interface 821 fixed according to a commercially established standard of memory cards, such as: MultiMedia (MMC) card; Reduced Size (RS-MMC) card; SD card-micro SD card; mini SD card; compact SD card; xD-Picture card; CompactFlash card; multiuse card; memory stick; ID card; PCMCIA (CardBus) card; Solid State Disk (SSD, e.g., 1.8 inch, 2.5 inch, or 3.5 inch hard drive form factor); SIM (phone) card, 72-pin SIMM card, 128-pin DIMM card, PCI Express (PCIe) module; chipcard; smartcard, USB card. The nonvolatile memory device 111 may also be implemented as a multi chip package (MCP) (see, e.g., FIG. 10) or as a single integrated circuit die 902 (see FIG. 9), incorporating a controller 811 and at least one nonvolatile memory 17 having the writing driver 330A of FIG. 5.

FIG. 11 illustrates a nonvolatile memory device 111 having the "SD card" form factor as an example of a nonvolatile memory device 111 including the nonvolatile memory system 800 of FIG. 8. The SD card's physical structure (form factor) physical interface part 821 and a method of manufacturing the same are described in U.S. Pat. No. 6,040,622, assigned to SanDisk Corporation. The U.S. Pat. No. 6,040,622 patent is incorporated herein by reference.

A nonvolatile memory device 111 includes a physical interface part 821 for performing physical and electrical interfacing with outside (host) sockets, ports, slots, or receptacles, a controller (CONTROLLER PART) 811 having the buffer memory (BUFFER MEMORY) 35 and performing operation control of the memory card, and one or more nonvolatile memories 17, 19, 21 each having a writing driver 330A of FIG. 5. The controller 811 is electrically coupled to the physical interface part 821 by the data bus (DATA) and the address bus (ADDRESS), and coupled to the nonvolatile memories 17, 19, 21 by the data bus (DATA) and the address bus (ADDRESS). Each of the nonvolatile memories 17, 19, 21 can perform synchronous read operations in addition to asynchronous read operations. The memory system 800 embodied in the memory device 111 can perform execution-in-place (XIP) operations. The controller 811 in the memory system 800 in the nonvolatile memory device 111 may include an address comparing circuit and a command generating circuit (not shown).

As described above, the nonvolatile memory device 111 (e.g., SD card) according to this exemplary embodiment can be inserted into combined with and used in portable electronic devices such as digital cameras. The electronic card can be inserted into, combined with and used in not only portable electronic devices but also various other electronic devices as shown in FIGS. 13A to 13J.

Figure 12:
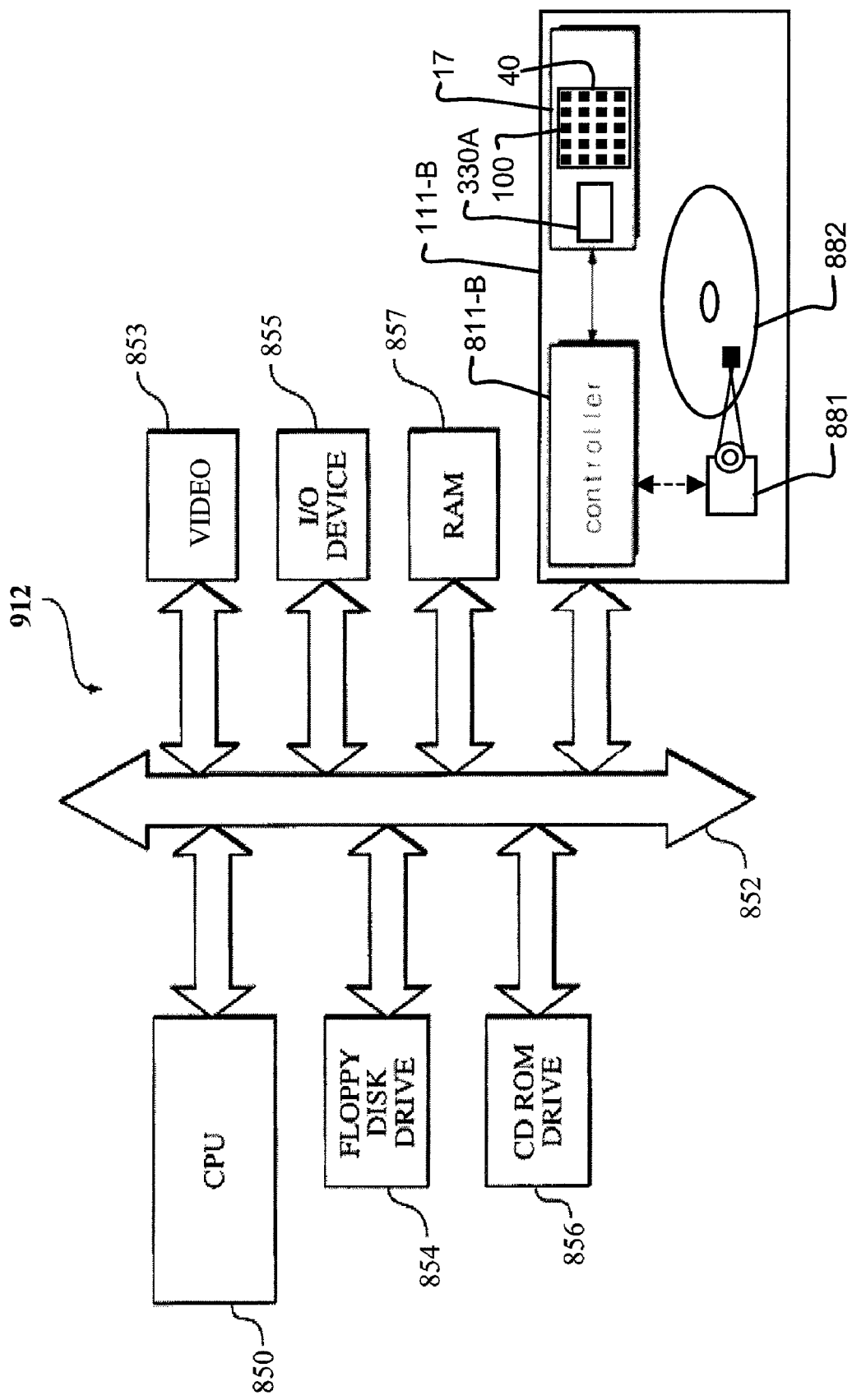
FIG. 12 is a block diagram of a processor based system 912 including the nonvolatile memory system 800 of FIG. 8.

FIG. 12 is a block diagram of a processor based system 912 comprising an exemplary embodiment of the nonvolatile memory system 800 of FIG. 8 having the writing driver circuit 330A.

The processor based system 912 is exemplary of a processor based system including the nonvolatile memory system 800 of FIG. 8 having for example, an SSD or Hybrid Drive embodiment of the nonvolatile memory device 111 of FIG. 11. Without being limiting, such a processor based system 912 could implement a personal computer system, digital camera system, a scanner, a machine vision system, a vehicle navigation system, a cellular (video enabled) phone, an auto focus system, a star tracker system, a surveillance system, a motion detection system, an image stabilization system for digital cameras, and a data compression system for high-definition television, all of which can utilize the nonvolatile memory system 800.

The processor based system 912 may further include a CMOS imager (not shown) preferably constructed as an integrated circuit that includes an array of pixels each containing a photosensor (e.g. a photogate or photodiode).

A processor based system 912, implementing a personal computer system, for example a laptop PC, generally comprises a central processing unit (CPU) 850, (e.g., a microprocessor), that communicates with a user and external devices through an input/output (I/O) port 855 (e.g., a USB port) over a bus 852. The personal computer system 912 also includes random access memory (RAM) 857 for execution of programs, and may include peripheral devices (such as for example, a floppy disk drive 854 and a compact disk (CD) ROM/DVD drive 856) and a video output 853 which also communicate with CPU 850 over the bus 852.

Figure 13A:
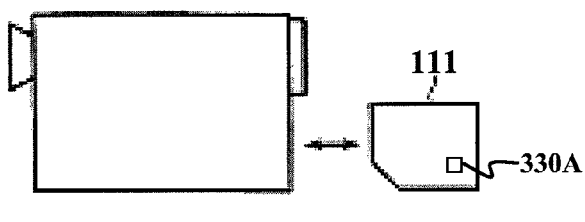
FIGS. 13A to 13J are illustrations showing electronic devices with an SD memory card embodiment of the nonvolatile memory device 111 of FIG. 11.
Figure 13F:
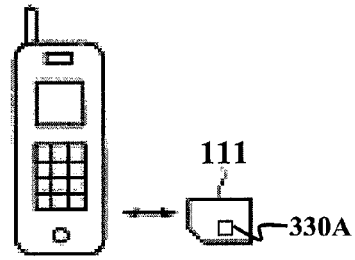
Figure 13B:
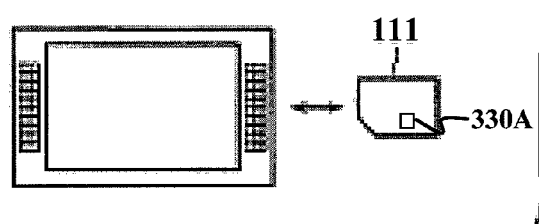
Figure 13G:
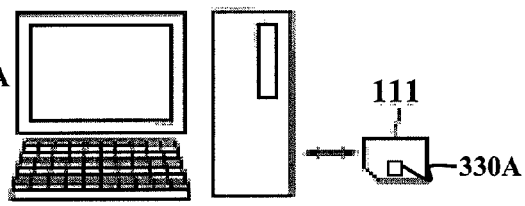

The processor based system 912 of FIG. 12 can implement a personal computer and may include at least one nonvolatile memory device 111 (111-B), implementing a Solid State Disk (SSD) or a Hybrid Hard-Drive, having the nonvolatile memory system 800 of FIG. 8 including the writing driver 330A of FIG. 5. The exemplary nonvolatile memory device 111-B includes a physical interface (not shown) a controller 811 (811-B), a writing driver 330A of FIG. 5 and a nonvolatile memory cell array 40 having a plurality of non-volatile memory cells (e.g., variable resistive (phase-change) memory cell 100 of FIG. 1). In embodiments where the nonvolatile memory device 111-B implements a Solid State Disk (SSD) or a Hybrid Hard Drive (HHD), or a Hybrid RAID Drive (HRD), the physical interface will be the same as that of a commercially available hard-disk drive (e.g., ATA, SATA, SCSI, etc.). In embodiments where the nonvolatile memory device 111-B implements a Hybrid Hard Drive (HHD), or a Hybrid RAID Drive (HRD), the device 111-B will include a hard disk 812 and a hard-disk controller 881. In embodiments where the nonvolatile memory device 111-B implements a Solid State Disk (SSD), the device 111-B will not include a hard disk 882 nor the hard-disk controller 881. The processor based system 912 of FIG. 12 may further include a slot for inserting the nonvolatile memory device 111 (e.g., SD card) of FIG. 11 having the writing driver 330A of FIG. 5, as illustrated in FIG. 13A, 13F or 13G.

The nonvolatile memory device 111-B implementing a Hybrid Hard Drive (HHD), has a buffer differing from the conventional cache buffer existing on conventional hard-disk drives not only in size but also in structure, composition, and qualities. A conventional cache is made out of volatile memory that is erased when the drive is powered down. The HHD 111-B according to an embodiment of the invention adds an additional layer of cache consisting of nonvolatile (VRM) memory 17 that can be accessed quickly when the drive is powered on. Adding a large nonvolatile buffer to the hard drive can also reduce the drivels power consumption, thereby increasing the battery life, and reducing the time required for the system to resume its operation after suspension. Boot-up or resume time will occur about twice as fast as conventional hard disk drives and laptop batteries typically will provide 20-30 minutes more power. Another added bonus of the HHD 111-B is the improved reliability due to less mechanical wear and tear. For example, booting is very seek-intensive, so with much of the boot time, the processor has low utilization because it's waiting for data from the rotating disk. With the nonvolatile (VRM) buffer 17, there are no mechanical latencies for random data retrievals, hence a significant performance gain. In terms of power consumption, the system is able to buffer many of the writes to the nonvolatile (VRM) memory 17, thus enabling the drive to spin down. Once the nonvolatile buffer 17 is full, the drive is spun up and the nonvolatile buffer 17 is flushed, so the duty cycle of the drive can be dramatically reduced. Because the drive is one of the most vulnerable parts of the system to mechanical trauma, overall system reliability may be improved by up to five-times by keeping the spindle spun down and the heads parked.

In embodiments where the nonvolatile memory device 111-B implements a Solid State Disk (SSD), the hard disk 882 is eliminated and functionally replaced by the nonvolatile memory 17 which permanently stores programs and user data.

The processor based system 912 of FIG. 12 can also implement a cellular phone (e.g., see FIG. 13G) and may include at least one embedded nonvolatile memory device 111 of FIG. 11 having the nonvolatile memory system 800 of FIG. 8 including the writing driver 330A of FIG. 5. In such cell phone embodiments of the processor based system 912, the video port 853 will typically be implemented as a flat panel (e.g., LCD) display controller, and the system 912 will further include RE circuits (e.g. an RF MODEM, ADPC codec circuits, TDMA circuits, not shown) for transmission and reception of radio signals, and the nonvolatile memory device 111-B may store registered ID numbers, programs, and user data (e.g., phone books, documents, digital images, digital video, etc.)

Figure 13C:
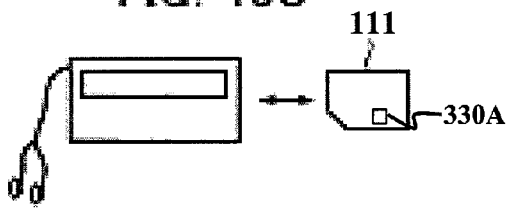
Figure 13H:
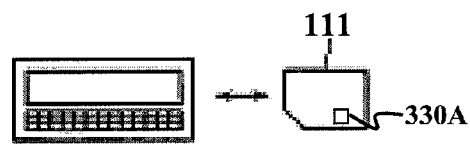
Figure 13D:
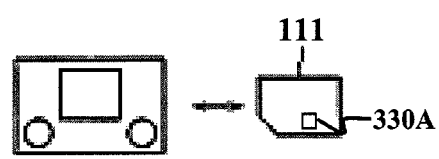
Figure 13I:
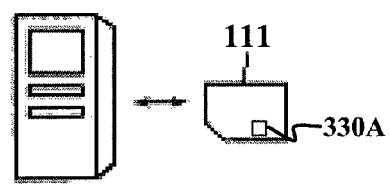
Figure 13E:
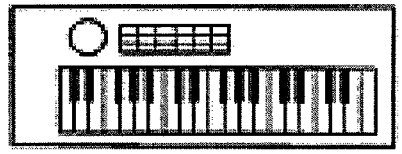
Figure 13J:
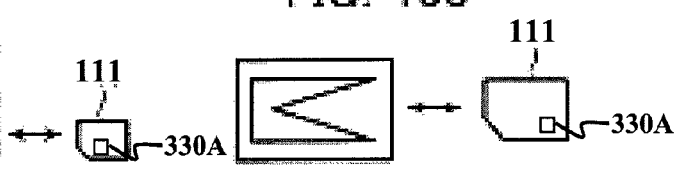

FIGS. 13A to 13J are illustrations showing electronic devices that may be combined with the nonvolatile memory device 111 (e.g., SD card) of FIG. 11 including the writing driver 330A of FIG. 5. The nonvolatile memory device 111 (e.g., SD card) can be inserted into, combined with and used in a digital/video camera as shown in FIG. 13A, a television as shown in FIG. 138, an audio instrument as shown in FIG. 13C, a gaming machine as shown in FIG. 13D, an electronic musical instrument as shown in FIG. 13E, a cellular phone as shown in FIG. 13F, a personal computer as shown in FIG. 13G, a personal digital assistant (PDA) as shown in FIG. 13H, a voice recorder as shown in FIG. 13I, and a PC card (e.g., CardBus card) as shown in FIG. 13J. Each of the electronic devices shown respectively in FIGS. 13A to 13J may further include an embedded nonvolatile memory system 800 as shown in FIG. 8, for storage of settings, product IDs, manufacturer information, product configuration data, and user data. For example, the digital/video camera of FIG. 13A may include an "internal memory" having the nonvolatile memory system 800 of FIG. 8 including the writing driver 330A of FIG. 5 and also a slot for inserting the nonvolatile memory device 111 (e.g., SD card) of FIG. 11 having the writing driver 330A of FIG. 5. Similarly, the cellular phone of FIG. 13 may include an "internal memory" having the nonvolatile memory system 800 of FIG. 8 including the writing driver 330A of FIG. 5 and also a slot for inserting the nonvolatile memory device 111 (e.g., a micro SD card) of FIG. 11 having the writing driver 330A of FIG. 5. Similarly, the personal computer of FIG. 13G may include a Solid State Disk (SSD) or a Hybrid Hard-Drive having the nonvolatile memory system 800 of FIG. 8 including the writing driver 330A of FIG. 5 and also a slot for inserting the nonvolatile memory device 111 (e.g., SD card) of FIG. 11 having the writing driver 330A of FIG. 5.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A hand held system, comprising:
a memory device including an array of nonvolatile memory cells and a writing driver circuit for driving at least one of the nonvolatile memory cell; and
a controller configured to be coupled to the memory device to control the memory device,
wherein the writing driver circuit includes:
a pulse selection circuit configured to output a selected one of a reset pulse and a set pulse in response to a logic level of data and the data;
a current control circuit configured to receive a bias voltage, to output a control signal at a second level during an enable duration of the reset pulse when the data is at a first level, and to output the control signal at a first level during an enable duration of the set pulse when the data is at a second level; and
a current drive circuit configured to output writing current to the at least one of the nonvolatile memory cell in response to the control signal during the enable duration of the reset pulse or of the set pulse.

2. The hand held system of claim 1, wherein the nonvolatile memory cell are a variable resistive memory (VRM) cells.

3. The hand held system of claim 1, wherein the hand held system is a SIM card for cellular telephones.

4. The hand held system of claim 1, wherein the hand held system is one of a SIMM card a DIMM card.

5. The hand held system of claim 1, wherein the hand held system is one of a chip card, a smart card and an ID card.

6. The hand held system of claim 1, wherein the hand held system is a removable memory earn such as MMC Card, a SD memory card, a multiuse card, a compact SD card, a mini SD card, a micro SD card, a memory stock and a USB device.

7. The hand held system of claim 1, wherein the memory device consists essentially of integrated circuits and metallization on an integrated circuit die.

8. The hand held system of claim 1, wherein the controller includes a buffer memory and performs control of the memory device through a data bus and an address bus.

9. A high capacity storage system, comprising:
a memory device including an array of nonvolatile memory cells and a writing driver circuit for driving at least one of the nonvolatile memory cells; and
a controller configured to be coupled to the memory device to control the memory device,
wherein the motion driver circuit includes:
a pulse selection circuit configured to output a selected one of a reset pulse and a set pulse in response to a logic level of data and the data;
a current control circuit configured to receive a bias voltage, to output a control signal at a second level during an enable duration of the reset pulse when the data is at first level, and to output the control signal at a first level during an enable duration of the set pulse when the data is at a second level; and
a current drive circuit configured to output writing current to the at least one of the nonvolatile memory cells in response to the control signal during the enable duration of the reset pulse or of the set pulse.

10. The high capacity storage system of claim 9, wherein the nonvolatile memory cells are variable resistive memory (VRM) cells.

11. The high capacity storage system of claim 9, wherein the high capacity storage system is a Solid State Disk (SSD).

12. The high capacity storage system of claim 9, wherein the high capacity storage system is one of a Hybrid Disk Drive (HDD) and a Hybrid RAID Drive (HRD).

13. The high capacity storage system of claim 9, further comprising:
a hard disk; and
a hard disk controller configured to coupled to the hard disk to control the hard disk,
wherein the memory device serves as a buffer memory.

14. The high capacity storage system of claim 9, further comprising:
a CPU configured to be coupled to the controller to access the memory device.

15. The high capacity storage system of claim 14, wherein the high capacity storage system is implemented as one of a personal computer system, a digital camera system, a scanner, a machine vision system, a vehicle navigation system, a cellular phone, an auto focus system, a star tracker system, a surveillance system, a motion detection system, an image stabilization system for digital cameras and a data compression system for high-definition television.

16. A multi-chip package, comprising:
a first integrated circuit die including a logic circuit; and
at least one second integrated circuit die including an array of nonvolatile memory cells and a writing driver circuit for driving at least one of the nonvolatile memory cells, the writing driving circuit including:
a pulse selection circuit configured to output a selected one of a reset pulse and a set pulse in response to a logic level of data and the data;
a current control circuit configured to receive a bias voltage, to output a control signal at a second level during an enable duration of the reset pulse when the data is at a first level, and to output the control signal at a first level during an enable duration of the set pulse when the data is at a second level; and
a current drive circuit configured to output writing current to the nonvolatile memory cell in response to the control signal during the enable duration of the reset pulse or of the set pulse.

17. The multi-chip package of claim 16, wherein the nonvolatile memory cells are variable resistive memory (VRM) cells.

18. The multi-chip package of claim 16, wherein the logic circuit is a CPU.

19. The multi-chip package of claim 16, further comprising an interspersed insulating adhesive layers disposed between each adjacent pair of the first and the at least one second integrated circuit die.

20. The multi-chip package of claim 19, further comprising an insulating substrate,
wherein the first integrated circuit die, the at least one second integrated circuit die and the interspersed insulation adhesive layers are mounted on the insulating substrate.

* * * * *